Aug. 8, 1967 F. W. GUTZWILLER 3,335,291

ZERO VOLTAGE SWITCHING CIRCUIT USING GATE CONTROLLED CONDUCTING DEVICES

Filed March 11, 1965 2 Sheets-Sheet 1

INVENTOR
FRANK W. GUTZWILLER

BY [signature]

ATTORNEY

INVENTOR
FRANK W. GUTZWILLER

BY Frank L. Neuhauser

ATTORNEY

United States Patent Office 3,335,291
Patented Aug. 8, 1967

3,335,291

ZERO VOLTAGE SWITCHING CIRCUIT USING GATE CONTROLLED CONDUCTING DEVICES

Frank W. Gutzwiller, Auburn, N.Y., assignor to General Electric Company, a corporation of New York
Filed Mar. 11, 1965, Ser. No. 438,886
6 Claims. (Cl. 307—88.5)

ABSTRACT OF THE DISCLOSURE

An SCR is connected in series with an alternating current source and a load. A transistor connected to the SCR's gate and a control circuit connected between the source and the transistor, permit the SCR to be turned on by current from the source only at the beginning of a half-cycle of source voltage. A switch or timing circuit and a capacitor in the control circuit maintain the transistor off at the beginning of the half-cycle if the SCR is to conduct, or permit the transistor to turn on at the beginning of a half-cycle, before the SCR can conduct and keep the transistor on during that half-cycle so that the SCR cannot thereafter conduct. Alternately, a TRIAC or a second, reverse-parallel connected SCR is used with an inductance supplying current to their gate during a succeeding half-cycle.

My invention relates to current control circuits and, more specifically, to control circuits switching relatively high energy to a load.

It is not uncommon to have communications interference problems arise as the result of radio and audio frequency noise signals which are generated when a high power circuit is closed or opened. With the application of a voltage pulse to a circuit component to close the circuit at some point in a power source voltage wave, both the sudden pulse and the source voltage may cause oscillations among reactive circuit components and thus the generation of noise signals. These noise signals may often interfere with radio reception. In addition, when the switching is accomplished with mechanical switches there is an additional problem of noise signals generated by contact bounce. A further aggravation of this problem is found when a high power circuit is opened in a random manner. Abrupt termination of current flow also causes radio and audio noise signals to be generated. To eliminate the effects of such objectional noise signals, expensive and cumbersome RF and audio filters have been used in many high power switching circuits.

It has been proven experimentally that most A-C circuits generate a minimum of noise signals if they are opened when the circuit current is zero and if they are closed when the source voltage is zero. When gate controlled conducting devices such as the SCR are used as switching components they minimize some of the noise problems due to their inherent latching characteristics; that is to say, once they are turned on they can turn off only when an A-C current flowing through them is zero. For example, an SCR opens a circuit when the current flowing through it reaches zero. As long as a gate drive current has been removed from the gate electrode of the SCR it will not begin to conduct again. Thus, the gate controlled conducting devices operate in accordance with one of the experimentally found conditions for generating a minimum of noise signals. However, even using gate controlled conducting devices, noise frequencies are generated when the circuit is closed and must be eliminated by means of filters.

Therefore, it is an object of my invention to provide a control circuit which closes only when the source voltage is zero.

It is a further object of my invention to provide a control circuit which switches with a minimum of RF and audio noise interference.

It is another object of my invention to provide an improved control circuit which eliminates the need for cumbersome and expensive noise filters.

Briefly stated, and in accordance with one aspect of my invention, I provide a current controlling circuit in which a gate controlled conducting device having a gate electrode is connected to a power source and a load so that the energization of the load may be controlled. A semiconductor device having a control electrode is connected to the gate electrode of the gate controlled device to control the conduction state thereof. The semiconductor device is so connected to the gate electrode that the conduction state of the gate controlled device may change when the energization state of the semiconductor device changes. The semiconductor device in turn is connected to the source voltage by means of circuit components which control the energization state of the semiconductor device. In turn the semiconductor device will not permit the gate controlled conducting device to become conductive until the beginning of a half-cycle of supply voltage of appropriate polarity.

While the specification concludes with claims particularly pointing out and distinctly claiming the subject matter which I regard as my invention, it is believed the invention will be better understood from the following description taken in connection with the accompanying drawings in which:

FIG. 1 is a schematic diagram of one embodiment of my invention;

FIGS. 2*a*–2*d* are voltage diagrams showing the voltage levels at various points of the schematic diagram shown in FIG. 1;

Figure 1:
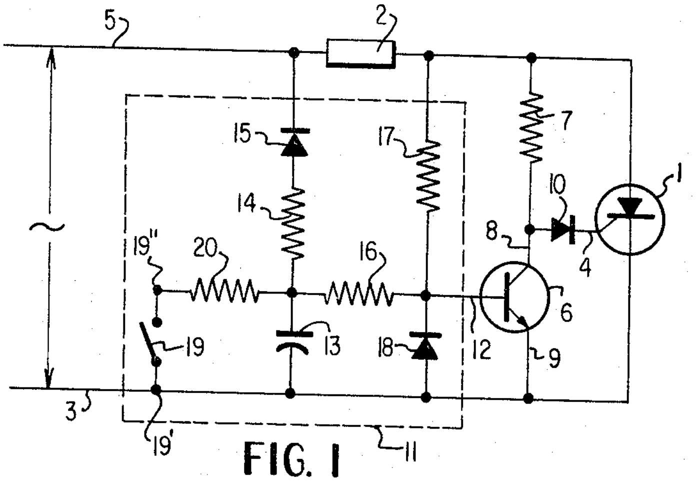

A circuit for controlling the energization of a load by controlling the number of half-cycles of source voltage applied during a period of utilization is shown in FIG. 1. This circuit includes a gate controlled conducting device such as an SCR 1 which is connected to a circuit load 2 and to a common terminal 3 of an A-C power source. The load 2 is further connected between the SCR 1 and a terminal 5 of the power source. While FIG. 1 illustrates an SCR, the gate controlled conducting device may be any latching device where a gate electrode, such as the gate electrode 4 of the SCR 1, causes it to change conduction state and which opens the circuit when the circuit current is zero.

A semiconductor device such as a transistor 6 is connected between the terminal 3, and a point between the SCR 1 and the load 2 through a resistor 7. The collector-emitter junction of the transistor 6 is connected in shunt with the gate-cathode junction of the SCR 1, through the collector electrode 8, the emitter electrode 9 and a diode 10. The transistor 6 can control the state of conduction of the SCR 1 since when the transistor 6 is conducting it shunts current from the gate-cathode junction of the SCR 1. If at this time the SCR 1 is not conducting, the SCR 1 will not begin to conduct until the transistor 6 no longer shunts this junction as no gate to cathode current will flow to cause the SCR to conduct in the manner well-known in the art.

A control means 11, shown as a control circuit in this preferred embodiment of my invention, is connected to the base electrode 12 of the transistor 6 to control the energization state of the transistor 6. The control circuit 11 includes an energy storage means comprising a capacitor 13 which may be charged during one half-cycle of the voltage source through a resistor 14 and a diode 15 which is connected to the terminal 5. The capacitor 13 is connected to the base electrode 12 of the transistor through a resistor 16, while a resistor 17 provides a current path for the base electrode 12. A diode 18 is connected between the base electrode 12 and the emitter electrode 9 in shunt with the base-emitter junction of the transistor 6. The transistor 6 is de-energized as long as the diode 18 is forward biased. The forward bias of the diode 18 may be provided either by the source voltage through the resistor 17 or the voltage stored by the capacitor 13 through the resistor 16. The control circuit 11 also includes a switching means 19, connected across the terminals 19' and 19'' shown as a mechanical switch, which is connected through a resistor 20 across the capacitor 13 to control the charging and discharging of the capacitor 13. When the switch 19 is opened, the capacitor 13 can charge through the diode 15 and the resistor 14. When the switch 19 is closed, the capacitor 13 is precluded from charging since the resistance of resistor 20 is low as compared with that of the resistor 14.

Figures 2A, 2B, 2C, 2D:
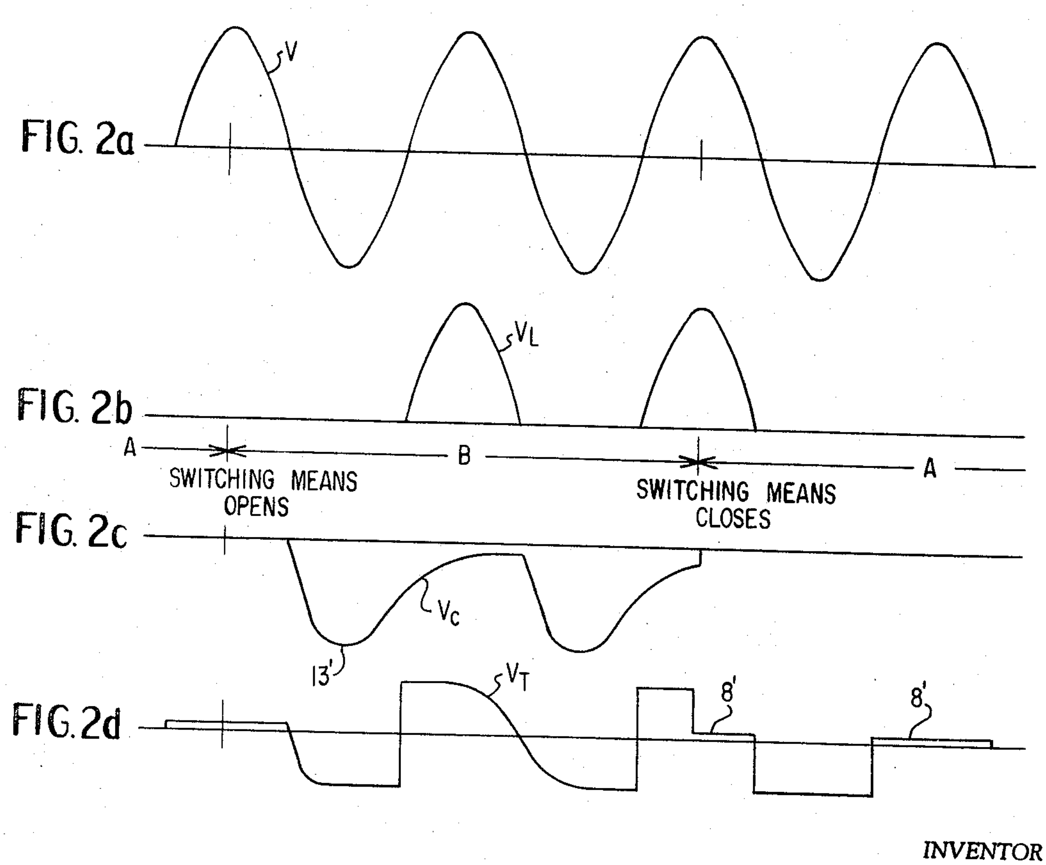

FIG. 2 illustrates the form of a voltage wave at various points of the circuit shown in FIG. 1, during the operation of this circuit embodiment of my invention. FIG. 2(*a*) shows a source voltage V applied to the terminals 3 and 5. FIG. 2(*b*) shows the voltage $V_L$ across the load 2, while FIG. 2(*c*) shows the voltage $V_C$ across the capacitor 13 and FIG. 2(*d*) shows the voltage $V_T$ at the collector electrode 8 of the transistor 6.

The operation of the arrangement of FIG. 1 may be understood by reference to the curves of FIG. 2. In one state with the switch 19 open, the capacitor 13 is charged on the negative half-cycles of source voltage, i.e., when terminal 3 is positive with respect to terminal 5, through a circuit consisting of capacitor 13, resistor 14, and diode 15 to the terminal 5. Assuming that the switch 19 is closed randomly, as indicated in FIG. 2(*b*) and remains closed during the interval A, any charge on the capacitor 13 is discharged through the resistor 20 and the switch 19, and the voltage thereacross is zero as may be seen in FIG. 2(*c*). Thus, during a positive half-cycle of the source voltage, i.e., when terminal 5 is positive in polarity with respect to terminal 3, a positive voltage is applied to the collector electrode 8, as shown in FIG. 2(*d*). This positive voltage is applied to the base electrode 12 through the resistor 17 since the diode 18 is reverse biased by the positive voltage. Under these conditions the transistor 6 begins to conduct and continues to conduct during the remaining portion of the positive half-cycle of the source voltage. If the switch 19 is closed after the beginning of a positive half-cycle of the source voltage, as shown in FIG. 2(*b*) the SCR 1 will have begun to conduct because the resistor 7 is small enough to allow a sufficient gate current to flow through the SCR 1 when the source voltage is only a few volts in magnitude. Due to its latching characteristics, the SCR continues to conduct during the remaining portion of such a positive half-cycle of the source voltage.

During the next negative half-cycle of the source voltage with the switch 19 closed the capacitor 13 cannot charge because the resistor 20 is connected across it to the resistor 14. Therefore during the succeeding positive half-cycle of the source voltage the diode 18 is reverse biased and current flows through the resistor 17 to the base electrode 12 of the transistor 6, as noted by the low voltage at 8' FIGURE 2(*d*) due to the voltage drop across resistor 7 when the transistor 6 conducts. The resistance of resistor 17 is such that at the beginning of this positive half-cycle a sufficient current flows therethrough to turn on the transistor 6 prior to the time when current flowing through the resistor 7 turns on the SCR 1. Consequently, the transistor 6 shunts gate current from the SCR 1, and the SCR 1 remains nonconducting. The SCR 1 is nonconducting as long as the transistor 6 continues to shunt the gate-cathode junction of the SCR 1.

If the switch 19 is opened after the beginning of any positive half-cycle of the source voltage wave, the capacitor 13 remains discharged and thus the diode 18 remains reverse biased. Base current for the transistor 6 continues to flow through the resistor 17, and the transistor 6 shunts the gate-cathode junction of the SCR 1. Once the transistor 6 is energized it keeps the SCR 1 nonconducting throughout a positive half-cycle of the source voltage, no matter how often the switch 19 is actuated thereafter. Therefore, the SCR 1 cannot begin to conduct during a positive half-cycle unless it does so at the beginning of this half-cycle.

If the switch 19 is opened randomly and remains open during the interval B, as shown in FIG. 2(*b*), the capacitor 13 begins to charge during the next negative half-cycle of the source voltage. The capacitor 13 continues to charge until the source voltage has reached its peak value during the negative half-cycle as shown at 13' in FIG. 2(*c*). Thereafter, the capacitor 13 discharges through the resistor 16 and the diode 18. The RC time constant of the resistor 16 and the capacitor 13 is such that the capacitor 13 keeps the diode 18 forward biased to shunt the base-emitter junction of the transistor 6 during a portion of the positive half-cycle of the source voltage. Thus, during the next positive half-cycle of the source voltage the transistor 6 remains de-energized and the gate current flows through the resistor 7 to cause the SCR 1 to conduct. Due to the latching characteristics of the SCR 1, it continues to conduct during the positive half-cycle of the source voltage.

Figure 3:
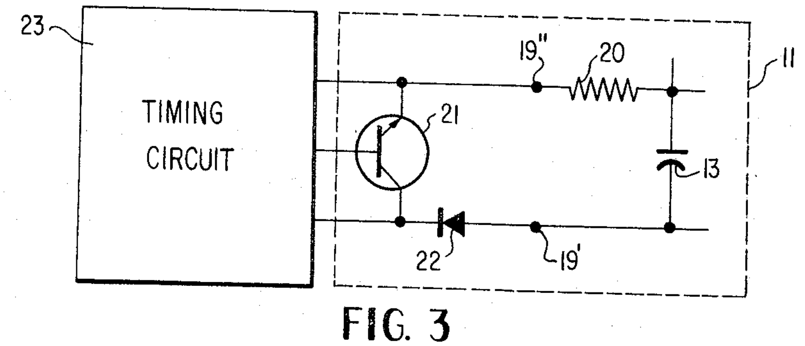
FIG. 3 is a schematic digaram showing one modification of my invention.

The embodiment of FIG. 3 is intended as illustrative of the invention. Thus, the switch 19 may in fact be constituted by an automatic control means in order that the invention may be used to provide predetermined amounts of power to a load. The load may be a motor, heating element, battery under charge, etc. and the circuit of FIG. 1 in conjunction with an automatic control for switch 19 may control the energization of such a load by determining the number of half-cycles of voltage applied thereto in some time interval. Such an automatic control is shown in the embodiment of FIG. 3.

FIG. 3 shows a modification of my invention in which a semi-conductor device, such as a transistor 21, is connected through a diode 22 to the terminals 19' and 19''. The transistor 21 is energized in response to a timing circuit 23. When the transistor 21 is energized by the timing circuit, it provides a low impedance path through the diode 22 so as to connect the resistor 20 in parallel with the capacitor 13 to discharge the capacitor. When the transistor 21 is de-energized it provides a high impedance between the resistor 20 and the diode 22. Thus, the transistor 21 can take the place of the switch 19 to control the energization of the transistor 6 and the conduction state of the SCR 1. The timing circuit 23 may be one such as that shown in the United States Patent 2,968,770–Sylvan, issued on Jan. 17, 1961, which can control the time during which the transistor 21 is conducting and nonconducting.

Figure 4:
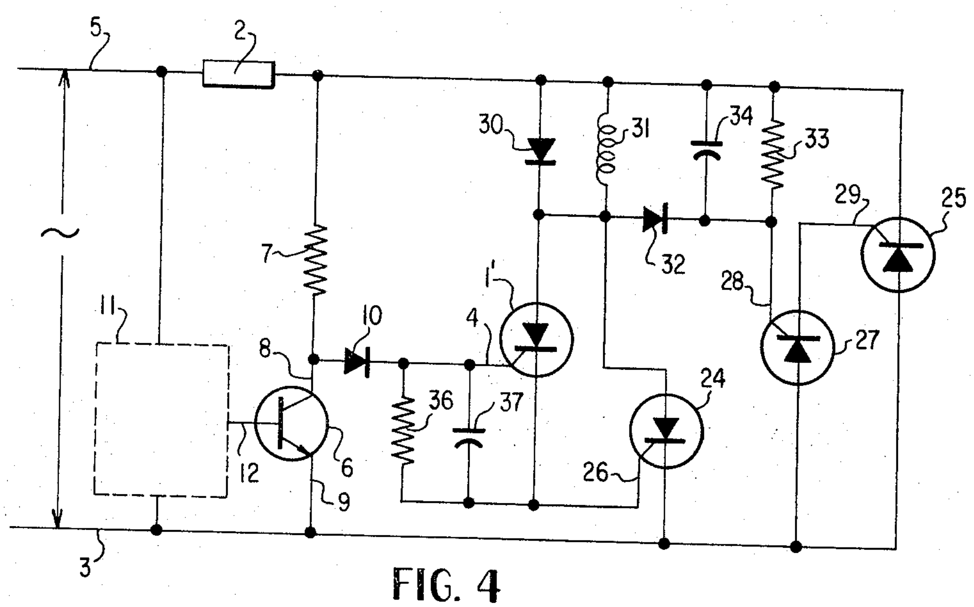
FIG. 4 is a schematic diagram showing another embodiment of my invention.

In many cases it is desirable to supply more energy to the load than may be controlled by a gate controlled switching device delivering only half-cycles of current. FIG. 4 shows a full wave A-C current control circuit utilizing the principles of my invention. Circuit components corresponding to those shown in FIG. 1 are numbered consistently therewith. In this circuit the power SCR's 24 and 25 are connected in a back-to-back or inverse parallel relationship. A pilot SCR which requires a low gate current to cause it to conduct is connected in the gate circuit of each of the power SCR's. Thus, the SCR 1' is connected as a pilot SCR to the gate electrode 26 of the SCR 24. An SCR 27 having a gate electrode 28 is connected as a pilot SCR to the gate electrode 29 of the power SCR 25. During a positive half-cycle when the pilot SCR 1′ conducts, current is coupled through the diode 30 and the inductor 31. The diode 30 carries most of the load current so that the inductor 31 may be a small radio-type choke, regardless of the magnitude of the load current. During a subsequent negative half-cycle the polarity of the voltage across the inductor 31 changes and current from the inductor 31 free-wheels through a diode 32 connected between the inductor 31 and the gate electrode 28 of the SCR 27. The resistor 33 and the capacitor 34 protect the SCR 27 from misfiring due to a transient condition at the source. In like manner, the resistor 36 and the capacitor 37 protect the SCR 1′.

The control means or control circuit 11 operates as described above with respect to FIG. 1 to control the energization state of the transistor 6 and thus cause the SCR 1′ to begin conducting at the beginning of one half-cycle of the source voltage. Assuming that the control means 11 maintains the transistor 6 nonconducting during a half-cycle of the source voltage when the terminal 5 is positive in polarity with respect to the terminal 3, current flows through the resistor 7, the diode 10, and the gate electrode 4 to the gate-cathode junction of the pilot SCR 1′. This current also flows through the gate electrode 26 of the power SCR 24 and through the gate-cathode junction of the SCR 24 to turn on the SCR 1′. A larger current immediately begins to flow through the diode 30, the inductor 31, the SCR 1′, and the gate-cathode junction of the SCR 24 to turn on the SCR 24. Thus, the power SCR 24 conducts at the beginning of a positive half-cycle of the source voltage and carries the load current.

During the next negative half-cycle of the source voltage, when the terminal 3 becomes positive with respect to the terminal 5, the SCR 24 is reverse biased. When the load current stops flowing through the SCR 24, the polarity of the voltage across the inductor 31 changes and current free-wheels through the diode 32, the gate electrode 28, the gate-cathode junction of the SCR 27, the gate electrode 29 and through the gate-cathode junction of the SCR 25. Since the SCR 27 is now forward biased by the voltage across the terminals 3 and 5, the SCR 27 conducts. It conducts current through the gate electrode 29 and the gate-cathode junction of the SCR 25 to cause the SCR 25 to become conducting. Thus, the power SCR 25 begins to conduct at the beginning of a negative half-cycle of the source voltage and carries the load current during this half-cycle.

The control means 11 can cause the transistor 6 to conduct at the beginning of a positive half-cycle and remain conducting for the duration of this half-cycle in accordance with my invention. Then the pilot SCR 1′ is nonconducting. Since no gate current flows through the gate electrode 26 of the power SCR 24, the power SCR 24 is also nonconducting. Therefore, current does not flow through the inductor 31 during this positive half-cycle, and it does not generate gate current for the pilot SCR 27 during the succeeding negative half-cycle. Thus, the pilot SCR 27 and the power SCR 25 are nonconducting. It is seen that this circuit provides an integral number of A-C cycles of power for the load 2 to prevent harmful saturation effects in magnetic load elements. For example, this circuit may be used to supply D-C current to the load by connecting the load between the power SCR's and using a pair of power rectifiers in a bridge circuit as is well-known in the art.

Figure 5:
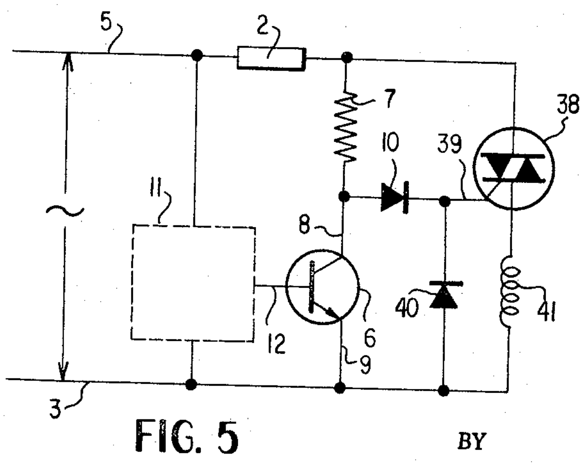
FIG. 5 is a schematic diagram showing still a further embodiment of my invention.

FIG. 5 shows a further embodiment of my invention designed to provide full-wave energy to the load 2. Control means 11 and the transistor 6 are used to control the state of conduction of a gate-controlled conducting device comprising a symmetrical switching triode device 38 often referred to as a TRIAC.

The diode 10 is connected between the collector electrode 8 of the transistor 6 and the gate electrode 39 of the TRIAC 38. A diode 40 is connected between the gate electrode 39 and the terminal 3 with the cathode connected to the gate electrode 39. An inductor 41 is connected between the TRIAC 38 and the terminal 3 to provide current through the diode 40 to the gate electrode 39 of the TRIAC 38 during a negative half-cycle of the source voltage.

When the terminal 5 is positive with respect to the terminal 3 during a positive half-cycle of the source voltage and the control means 11 maintains the transistor 6 nonconducting at the beginning of this positive half-cycle, current flows through the resistor 7, the diode 10, and the gate electrode 39 of the TRIAC 38 to turn on the TRIAC. During this half-cycle the load current flows through the inductor 41. At the beginning of the succeeding negative half-cycle, the polarity of the voltage across the inductor 41 changes and current flows from the inductor 41 and through the diode 40 and the gate electrode 39 to turn on the TRIAC 38. During this half-cycle of the voltage, load current flows through the TRIAC 38 and the inductor 41. This operation of the TRIAC 38 continues as long as the transistor 6 remains nonconducting.

When the control means 11 causes the transistor 6 to conduct at the beginning of a positive half-cycle of the source voltage and to remain conducting for the remainder of this half-cycle, in accordance with my invention, the transistor 6 shunts current from the gate electrode 39 of the TRIAC 38. Therefore, the TRIAC 38 does not conduct during this half-cycle of the source voltage. During the succeeding negative half-cycle of the source voltage the TRIAC 38 is held nonconducting since the inductor 41 has not been energized and cannot provide gate current through the gate 39 and the anode of the TRIAC 38 which is connected to the inductor 41.

My invention is not limited to the embodiments shown herein or to specific apparatus discussed above. To the contrary, my invention is capable of numerous modifications, as recognized by those skilled in the art, without deviating from the scope thereof and should not be limited in any sense except as defined by the appended claims.

What I claim as new and desire to secure by Letters Patent of the United States is:

1. A circuit for controlling current flow from an alternating current source through a load comprising:

(a) a first gate controlled conducting device having a gate electrode which is connected to said source, and means for connecting said first gate controlled conducting device in a circuit relation with said source and said load;

(b) a semiconductor switching device having a control electrode, means for connecting said semiconductor switching device in a circuit relation with said gate electrode so that the conduction state of said first gate controlled conducting device may change when the energization state of said semiconductor switching device changes, and means for connecting said source to said semiconductor switching device;

(c) a control means connecting said control electrode to said source, said control means including energy storage means and switching means connected across said energy storage means, said switching means controlling the charging and discharging of said energy storage means;

(d) whereby, if said energy storage means has been discharged by said switching means before the beginning of a first half-cycle of source voltage, said control means supplies current from said source to said control electrode to place said semiconductor switching device in a first energization state before said first gate controlled conducting device can be placed in a conducting state by current from said source, said control means maintaining said semiconductor switching device in said first energization state during the entire first half-cycle whereby said first gate controlled conducting device may not be placed in a conducting state during that half-cycle;

(e) whereby, if said energy storage means has not been discharged by said switching means before the beginning of said first half-cycle, said control means diverts current from said control electrode to maintain said semiconductor switching device in a second energization state so that said first gate controlled conducting device can be placed in a conducting state by current from said source.

2. The circuit of claim 1 wherein:

(a) said first gate controlled conducting device comprises a symmetrical switching device;

(b) said circuit further includes a second energy storage means connected in circuit relation with said symmetrical switching device and responsive to the current flow therethrough, and means connecting said second energy storage means to said gate electrode for providing current to said gate electrode at the beginning of a succeeding, second half-cycle of said source voltage when said symmetrical switching device is placed in a conducting state during said first half-cycle.

3. The circuit of claim 1, further including:

(a) a second gate controlled conducting device having a second gate electrode, means for connecting said second gate controlled conducting device in a reverse parallel connection with said first gate controlled conducting device;

(b) a second energy storage means in circuit relation with said first gate controlled conducting device, and means connecting said second gate electrode to said second energy storage means whereby said second energy storage means is responsive to current flow through said first gate controlled conducting device to provide current to said second gate electrode at the beginning of a second, succeeding half-cycle of source voltage when said first gate controlled conducting device is placed in a conducting state during said first half-cycle.

4. The circuit of claim 1 wherein said switching means comprises a second semiconductor switching device and a timing circuit which activates said second semiconductor switching device.

5. A circuit for controlling current flow from an alternating current source through a load comprising:

(a) a first silicon controlled rectifier having a gate electrode, a cathode electrode and an anode electrode, said anode and cathode electrodes being connected in a circuit relation with said source and said load;

(b) a transistor having a base electrode, an emitter and a collector electrode, said emitter and collector electrodes being connected in a circuit relation with said gate electrode so that when said transistor is placed in a first energization state, current is shunted from said gate electrode by said transistor, said emitter and collector electrodes being further connected to said source;

(c) a control means including a first diode and a capacitor connected across said source so that said capacitor is chargeable on alternate half-cycles of source voltage, switching means connected across said capacitor to control the charging and discharging thereof, means connecting said capacitor to said base electrode, a second diode connected in reverse parallel connection with a junction of the transistor disposed between said base and emitter electrodes, and means connecting said base electrode to said source;

(d) whereby, if said capacitor has been discharged by said switching means before the beginning of a first half-cycle of source voltage, said second diode is reverse biased by said source so as to permit current to flow from said source to said base electrode to place said transistor in said first energization state before said first silicon controlled rectifier can be placed in a conducting state by current from said source, said second diode being reverse biased by said source during the entire first half-cycle to thereby maintain said transistor in said first energization state so that said first silicon controlled rectifier may not be placed in a conducting state during that half-cycle;

(e) whereby, if said capacitor has not been discharged by said switching means before the beginning of said first half-cycle, said capacitor maintains said second diode in a forward-biased condition, thereby maintaining said transistor in a second energization state so that said first silicon controlled rectifier can be placed in a conducting state by current from said source.

6. The circuit of claim 5, further including:

(a) a second silicon controlled rectifier having a second gate electrode, and second anode and cathode electrodes, said second anode and cathode electrodes being connected in a reverse parallel connection with said anode and cathode electrodes of said first silicon controlled rectifier;

(b) an inductance in circuit relation with said anode and cathode electrodes of said first silicon controlled rectifier and a third diode connecting said inductance to said second gate electrode whereby said inductance is responsive to current flow through said first silicon controlled rectifier to provide current to said second gate electrode through said diode at the beginning of a succeeding second half-cycle of source voltage when said first silicon controlled rectifier conducts during said first half-cycle.

References Cited

UNITED STATES PATENTS

| | | | |
|---|---|---|---|
| 3,097,314 | 7/1963 | Harriman | 307—88,5 |
| 3,146,392 | 8/1964 | Sylvan | 307—88.5 |
| 3,283,177 | 11/1966 | Cooper | 307—88.5 |

S. D. MILLER, *Assistant Examiner.*

ARTHUR GAUSS, *Primary Examiner.*